United States Patent
Chen et al.

(10) Patent No.: US 8,923,088 B2
(45) Date of Patent: Dec. 30, 2014

(54) SOLID STATE STORAGE DEVICE WITH SLEEP CONTROL CIRCUIT

(71) Applicant: Lite-On Technology Corporation, Taipei (TW)

(72) Inventors: Yi-Jen Chen, Hsinchu (TW); Chi-Sian Chuang, Hsinchu (TW); Yi-Chung Lee, Hsinchu (TW); Shih-Chiang Lu, Hsinchu (TW); Ching-Chi Tsai, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 72 days.

(21) Appl. No.: 13/753,621

(22) Filed: Jan. 30, 2013

(65) Prior Publication Data

US 2014/0133240 A1    May 15, 2014

(30) Foreign Application Priority Data

Nov. 13, 2012    (CN) .......................... 2012 1 0453748

(51) Int. Cl.
| | |
|---|---|
| *G11C 7/00* | (2006.01) |
| *G11C 16/30* | (2006.01) |
| *G11C 5/14* | (2006.01) |

(52) U.S. Cl.
CPC ................ *G11C 16/30* (2013.01); *G11C 5/148* (2013.01)
USPC ....... 365/229; 365/194; 365/226; 365/185.33

(58) Field of Classification Search
CPC ...................................................... G11C 5/148
USPC .............................. 365/185.33, 194, 226, 229
See application file for complete search history.

(56) References Cited

U.S. PATENT DOCUMENTS

| | | | |
|---|---|---|---|
| 6,256,252 B1 * | 7/2001 | Arimoto ....................... 365/227 |
| 2008/0228414 A1 * | 9/2008 | Ito et al. .......................... 702/57 |
| 2008/0279017 A1 * | 11/2008 | Shimano et al. .......... 365/189.06 |

* cited by examiner

*Primary Examiner* — Hoai V Ho
(74) *Attorney, Agent, or Firm* — WPAT, PC; Justin King

(57) ABSTRACT

A solid state storage device receives a device sleep signal and a power signal from a host. The solid state storage device includes a control chip, a sleep control circuit, and a regulator. If the device sleep signal is activated, the control chip temporarily stores a system parameter into a flash memory module and then generates an acknowledge signal. The sleep control circuit receives the power signal, the device sleep signal and the acknowledge signal. If both of the device sleep signal and the acknowledge signal are activated, the sleep control circuit generates a disable state and a wake-up state. Moreover, if the power signal is received by the regulator and the sleep control circuit generates the disable state, the regulator stops providing a supply voltage to the control chip, so that the solid state storage device enters a sleep mode.

15 Claims, 8 Drawing Sheets

SOLID STATE STORAGE DEVICE WITH SLEEP CONTROL CIRCUIT

This application claims the benefit of People's Republic of China Application Serial No. 201210453748.8, filed Nov. 13, 2012, the subject matter of which is incorporated herein by reference.

FIELD OF THE INVENTION

The present invention relates to a solid state storage device, and more particularly to a solid state storage device with a sleep control circuit.

BACKGROUND OF THE INVENTION

As is well known, the data storage devices using NAND-based flash memories are widely used in a variety of electronic devices. For example, a SD card or a solid state drive (SSD) is a data storage device that uses a NAND-based flash memory to store data. Due to light weight, impact resistance, low power consumption and other benefits, the large-capacity solid state storage device has gradually replaced the conventional hard disc storage device.

FIG. 1 is a schematic functional block diagram illustrating the architecture of a conventional solid state storage device. As shown in FIG. 1, the solid state storage device 100 comprises a control chip 102, a regulator 104, and plural flash memory modules 111~11N. Generally, as the capacity of the solid state storage device 100 is increased, the number of the flash memory modules is increased.

The solid state storage device 100 is in communication with a host such as a computer host (not shown). According to a control signal, the data of the solid state storage device 100 is accessed by the host. For example, the control signal comprises a command signal, an address signal, a data signal, and so on. Moreover, according to a power signal (e.g. 5V), the host provides power to the solid state storage device 100.

In a normal operation mode, the data of the solid state storage device 100 can be read by the host. According to a read command signal and an address signal of the control signal, the data of a corresponding flash memory module is read by the control chip 102. Then, the data is converted into a data signal by the control chip 102 and transmitted to the host. Moreover, for writing a data from the host into the solid state storage device 100, the data is written into the corresponding flash memory module by the control chip 102 according to a write command signal, an address signal and a data signal of the control signal.

Moreover, the host may provide the power signal to the regulator 104 of the solid state storage device 100. Consequently, the regulator 104 may produce various voltages for powering all components of the solid state storage device 100. For example, the regulator 104 may provide a first supply voltage Vp1 to the control chip 102 and provide a second supply voltage Vp2 to the flash memory modules 111~11N in order to maintain the normal operation mode of the solid state storage device 100.

Generally, for reducing power consumption, most hosts may be operated in a sleep mode. In the sleep mode, most of circuits in the host are not powered on. Until the user wakes up the host, all circuits of the host are powered on again, and the host enters the normal operation mode again.

In the sleep mode of the host, the host may still provide the power signal to the peripheral device. Moreover, according to a device sleep signal DEVSLP of the control signal, the peripheral device is controlled to be in the sleep mode.

However, for some kinds of solid state storage devices 100, the control chip 102 is unable to support the sleep mode. That is, the device sleep signal DEVSLP fails to be received by the control chip 102. Under this circumstance, if the host is in the sleep mode, in response to the device sleep signal DEVSLP, the solid state storage device 100 cannot enter the sleep mode under the control of the control chip 102.

Meanwhile, the control chip 102 and the flash memory modules 111~11N are still powered on by the first supply voltage Vp1 and the second supply voltage Vp2 from the regulator 104. In other words, when the host is in the sleep mode, the conventional solid state storage device 100 is only maintained in an idle mode. In the idle mode, the power consumption of the conventional solid state storage device 100 is still high.

SUMMARY OF THE INVENTION

The present invention provides a solid state storage device with a sleep control circuit. Even if the control chip is unable to support the sleep mode, the additional sleep control circuit included in the solid state storage device can allow the solid state storage device to enter the sleep mode or awaken the solid state storage device from the sleep mode to the normal operation mode.

An embodiment of the present invention provides a solid state storage device. The solid state storage device receives a device sleep signal and a power signal from a host. The solid state storage device includes a control chip, a sleep control circuit, and a regulator. The control chip receives the device sleep signal. The control chip is connected to a flash memory module. If the device sleep signal is activated, the control chip temporarily stores a system parameter into the flash memory module and then generates an acknowledge signal. The sleep control circuit receives the power signal, the device sleep signal and the acknowledge signal. If both of the device sleep signal and the acknowledge signal are activated, the sleep control circuit generates a disable state and a wake-up state. Moreover, if the power signal is received by the regulator and the sleep control circuit generates the disable state, the regulator stops providing a supply voltage to the control chip, so that the solid state storage device enters a sleep mode.

Another embodiment of the present invention provides a solid state storage device. The solid state storage device receives a device sleep signal and a power signal from a host. The solid state storage device includes a first control chip, a second control chip, a sleep control circuit, and a regulator. The first control chip receives the device sleep signal. The first control chip is connected to a first group of flash memory modules. If the device sleep signal is activated, the first control chip temporarily stores a first system parameter into the first group of flash memory modules and then generates a first acknowledge signal. The second control chip receives the device sleep signal. The second control chip is connected to a second group of flash memory modules. If the device sleep signal is activated, the second control chip temporarily stores a second system parameter into the second group of flash memory modules and then generates a second acknowledge signal. The sleep control circuit receives the power signal, the device sleep signal, the first acknowledge signal and the second acknowledge signal. If all of the device sleep signal, the first acknowledge signal and the second acknowledge signal are activated, the sleep control circuit generates a disable state and a wake-up state. Moreover, if the power signal is received by the regulator and the sleep control circuit generates the disable state, the regulator stops providing a supply voltage to the first control chip and the second control chip, so that the solid state storage device enters a sleep mode.

A further embodiment of the present invention provides a solid state storage device. The solid state storage device receives a device sleep signal and a power signal from a host. The solid state storage device includes a first control chip, a second control chip, a sleep control circuit, and a regulator. The first control chip receives the device sleep signal. The first control chip is connected to a first group of flash memory modules. If the device sleep signal is activated, the first control chip temporarily stores a first system parameter into the first group of flash memory modules and then generates a first acknowledge signal. The second control chip receives the device sleep signal. The second control chip is connected to a second group of flash memory modules. If the device sleep signal is activated, the second control chip temporarily stores a second system parameter into the second group of flash memory modules. After the first acknowledge signal is generated by the second control chip, the second control chip generates a second acknowledge signal. The sleep control circuit receives the power signal, the device sleep signal and the second acknowledge signal. If both of the device sleep signal and the second acknowledge signal are activated, the sleep control circuit generates a disable state and a wake-up state. Moreover, if the power signal is received by the regulator and the sleep control circuit generates the disable state, the regulator stops providing a supply voltage to the first control chip and the second control chip, so that the solid state storage device enters a sleep mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a solid state storage device and a sleep control circuit thereof. Even if the control chip is unable to support the sleep mode, the additional sleep control circuit included in the solid state storage device can allow the solid state storage device to enter the sleep mode or awaken the solid state storage device from the sleep mode to the normal operation mode.

Figure 1:
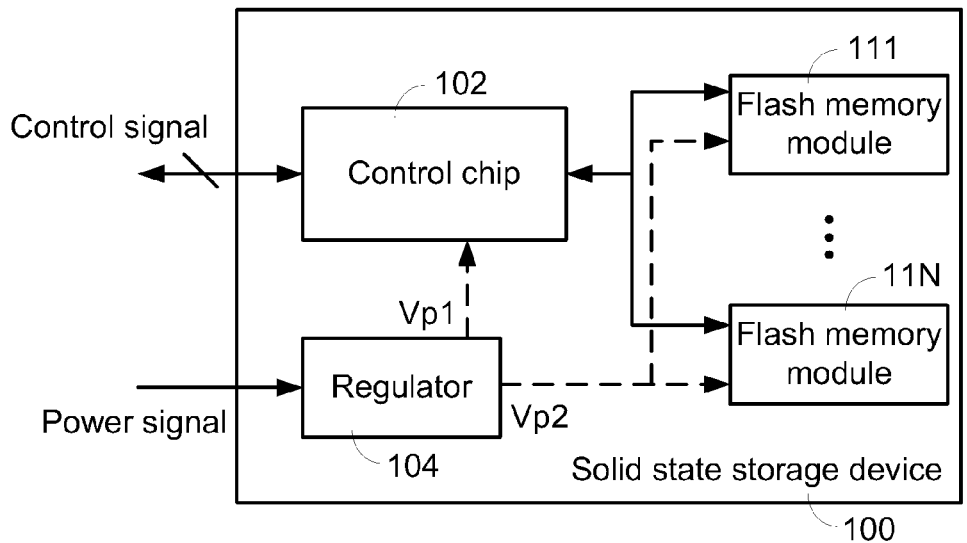
FIG. 1 (prior art) is a schematic functional block diagram illustrating the architecture of a conventional solid state storage device.
Figure 2:
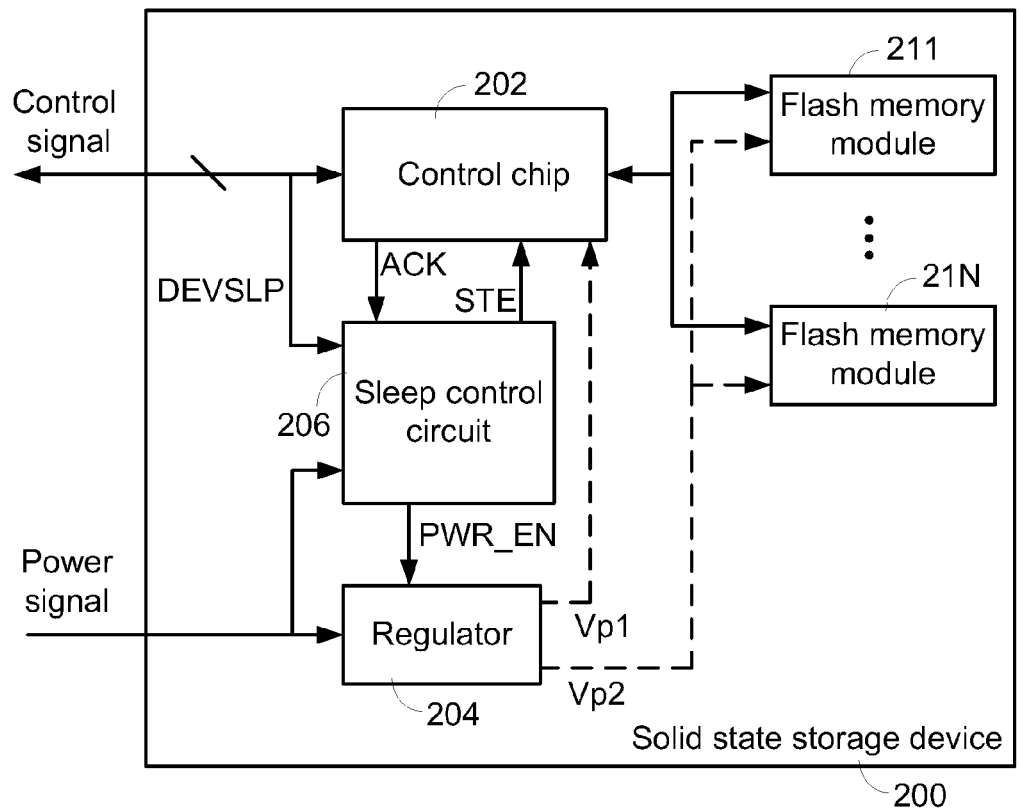
FIG. 2 is a schematic functional block diagram illustrating the architecture of a solid state storage device according to the present invention.

FIG. 2 is a schematic functional block diagram illustrating the architecture of a solid state storage device according to the present invention. As shown in FIG. 2, the solid state storage device 200 comprises a control chip 202, a regulator 204, a sleep control circuit 206, and plural flash memory modules 211~21N. Generally, as the capacity of the solid state storage device 200 is increased, the number of the flash memory modules is increased.

The solid state storage device 200 is in communication with a host such as a computer host (not shown). According to a control signal, the data of the solid state storage device 200 is accessed by the host. For example, the control signal comprises a command signal, an address signal, a data signal, a device sleep signal DEVSLP, or the like. Moreover, according to a power signal, the host provides power to the solid state storage device 200.

After the host is powered on, the power signal (e.g. 5V) is received by the solid state storage device 200, so that the solid state storage device 200 is started. Meanwhile, a state terminal STE of the sleep control circuit 206 provides a power on state, and a regulator enable terminal PWR_EN of the sleep control circuit 206 provides an enable state.

Moreover, the power signal is received by the regulator 204. According to the enable state provided by the regulator enable terminal PWR_EN, the regulator 204 provides a first supply voltage Vp1 to the control chip 202 and provide a second supply voltage Vp2 to the flash memory modules 211~21N.

After the first supply voltage Vp1 is received by the control chip 202, the control chip 202 realizes that the host is powered on according to the power on state provided by the state terminal STE. Consequently, the control chip 202 performs a start-up procedure. After the start-up procedure is completed, the solid state storage device 200 enters a normal operation mode.

In a normal operation mode, the data of the solid state storage device 200 can be read by the host. According to a read command signal and an address signal of the control signal, the data of a corresponding flash memory module is read by the control chip 202. Then, the data is converted into a data signal by the control chip 202 and transmitted to the host. Moreover, for writing a data from the host into the solid state storage device 200, the data is written into the corresponding flash memory module by the control chip 202 according to a write command signal, an address signal and a data signal of the control signal.

In a case that the solid state storage device 200 is controlled by the host to be in a sleep mode, the device sleep signal DEVSLP of the control signal is activated. Consequently, all system parameters are temporarily stored in a specified flash memory module by the control chip 202. After the procedure of temporarily storing the system parameters is completed, the control chip 202 issues an acknowledge signal ACK to the sleep control circuit 206. According to the acknowledge signal ACK, the state terminal STE of the sleep control circuit 206 is switched to a wake-up state. Next, a disable state is provided by the regulator enable terminal PWR_EN. Consequently, the regulator 204 stops providing the first supply voltage Vp1 and the second supply voltage Vp2 to the control chip 202 and the flash memory modules 211~21N, respectively. Under this circumstance, the solid state storage device 200 enters the sleep mode. In other word, only the sleep control circuit 206 is enabled in the sleep mode.

In a case that the host wakes up the solid state storage device 200, the device sleep signal DEVSLP of the control signal is inactivated. Meanwhile, the regulator enable terminal PWR_EN of the sleep control circuit 206 provides the enable state. Consequently, the regulator 204 provides the first supply voltage Vp1 and the second supply voltage Vp2 to the control chip 202 and the flash memory modules 211~21N, respectively. Next, according to the wake-up state provided by the state terminal STE, the control chip 202 realizes that the solid state storage device 200 is awakened from the sleep mode. Consequently, according to the system parameters previously stored in the specified flash memory module, the control chip 202 enters the normal operation mode again.

Since the sleep control circuit 206 is operated according to the device sleep signal DEVSLP and the power signal, only the device sleep signal DEVSLP and the power signal of the solid state storage device will be shown in the following diagrams. That is, the other signals are not shown.

In accordance with the present invention, plural general purpose IO ports of one or more control chips are controlled by firmware. Consequently, the use of the sleep control circuit can allow the solid state storage device to enter the sleep mode. The operations of the sleep control circuit will be illustrated in more details as follows.

Figure 3A:
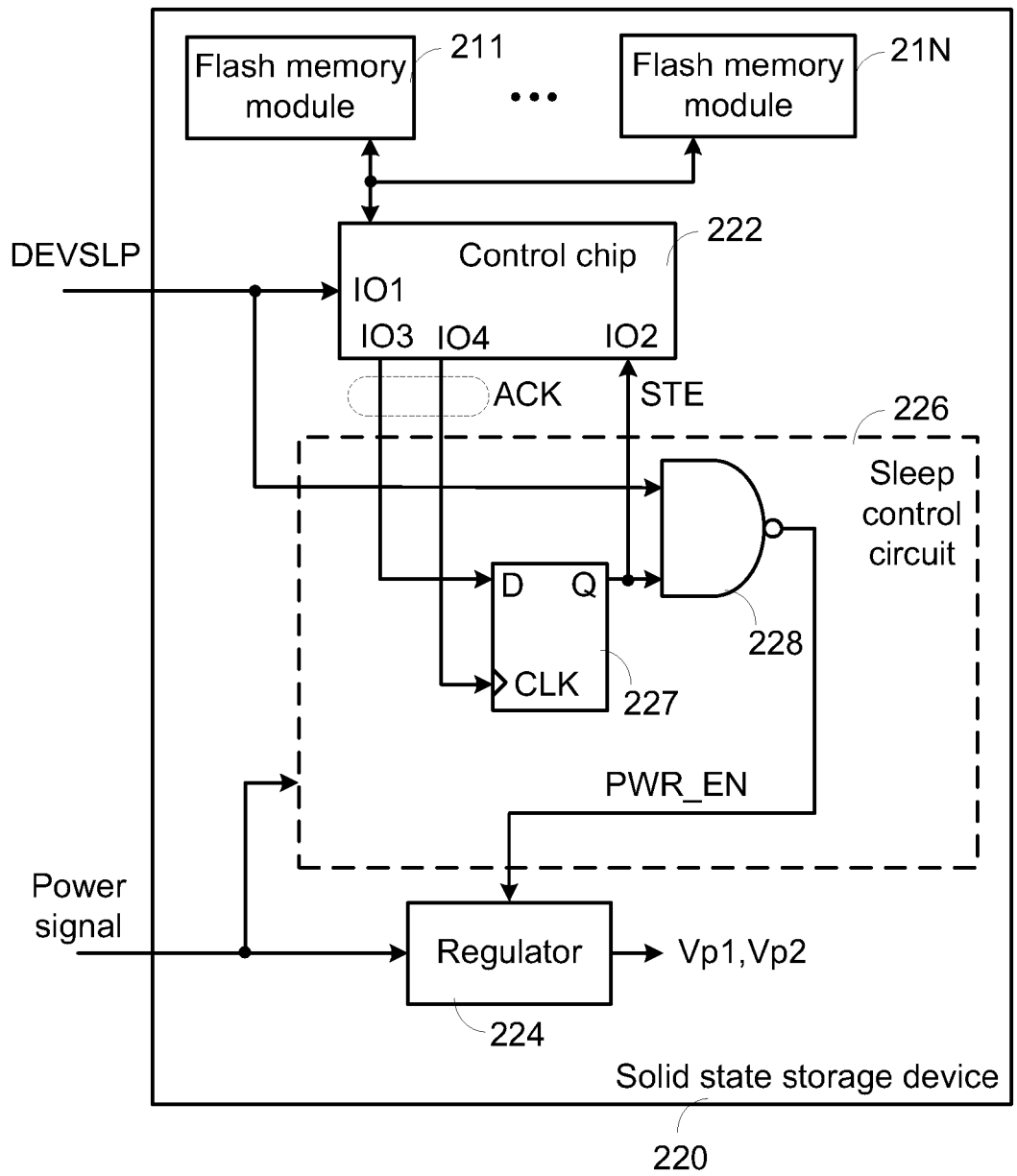
FIG. 3A is a schematic circuit diagram illustrating a solid state storage device according to a first embodiment of the present invention.

FIG. 3A is a schematic circuit diagram illustrating a solid state storage device according to a first embodiment of the present invention. As shown in FIG. 3A, the solid state storage device 220 comprises a control chip 222, a regulator 224, a sleep control circuit 226, and plural flash memory modules 211~21N. After the power signal and the enable state at the regulator enable terminal PWR_EN are received by the regulator 224, the regulator 224 provides the first supply voltage Vp1 and the second supply voltage Vp2 to the control chip 222 and the flash memory modules 211~21N, respectively.

In this embodiment, the low voltage level of the device sleep signal DEVSLP denotes a non-sleep mode, and the high voltage level of the device sleep signal DEVSLP denotes the sleep mode. Moreover, the high voltage level at the regulator enable terminal PWR_EN denotes the enable state, and the low voltage level at the regulator enable terminal PWR_EN denotes the disable state. Moreover, the power signal is continuously provided to the sleep control circuit 226. Moreover, the control chip 222 has plural input/output (IO) terminals (IO1, IO2, IO3 and IO4). The device sleep signal DEVSLP is received by the first IO terminal (IO1).

As shown in FIG. 3A, the sleep control circuit 226 comprises a D type flip-flop 227 and a NAND gate 228. The input terminal D of the D type flip-flop 227 is connected to the third IO terminal (IO3). The clock terminal CLK of the D type flip-flop 227 is connected to the fourth IO terminal (IO4). The device sleep signal DEVSLP is also received by the first input terminal of the NAND gate 228. The second input terminal of the NAND gate 228 is connected to the output terminal Q of the D type flip-flop 227. The output terminal Q of the D type flip-flop 227 is used as the state terminal STE of the sleep control circuit 226, and connected to the second IO terminal (IO2). Moreover, the output terminal of the NAND gate 228 is used as the regulator enable terminal PWR_EN of the sleep control circuit 226, and connected to the regulator 224.

Figure 3B:
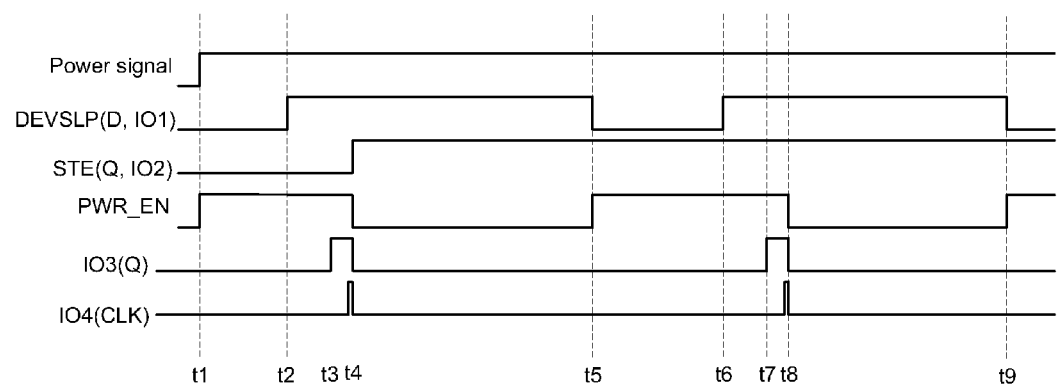
FIG. 3B is a schematic timing waveform diagram illustrating associated signals of the solid state storage device according to the first embodiment of the present invention.

FIG. 3B is a schematic timing waveform diagram illustrating associated signals of the solid state storage device according to the first embodiment of the present invention.

At the time point t1, the power signal (e.g. 5V) is provided to the solid state storage device 220. Meanwhile, the low voltage level of the device sleep signal DEVSLP denotes the non-sleep mode.

The power signal is also provided to the sleep control circuit 226. Since the output terminal Q of the D type flip-flop 227 is inactivated, the output terminal Q of the D type flip-flop 227 is at a low-level state (i.e. the power on state). Since the two input terminals of the NAND gate 228 are both at the low-level state, the output terminal of the NAND gate 228 is at a high-level state (i.e. the enable state).

After the power signal is received by the regulator 224, according to the enable state, the regulator 224 generates the first supply voltage Vp1 and the second supply voltage Vp2 to the control chip 222 and the flash memory modules 211~21N, respectively.

After the first supply voltage Vp1 is received by the control chip 222, the control chip 202 realizes that the host is powered on according to the power-on state provided by the state terminal STE. Consequently, the control chip 202 performs a start-up procedure. After the start-up procedure is completed, the solid state storage device 220 enters a normal operation mode.

At the time point t2, the high voltage level of the device sleep signal DEVSLP denotes the sleep mode. That is, the solid state storage device 220 is controlled by the host to enter the sleep mode. Meanwhile, the first IO terminal (IO1) of the control chip 222 detects that the device sleep signal DEVSLP is activated. Consequently, during the time interval from the time point t2 to the time point t3, all system parameters are temporarily stored in a specified flash memory module by the control chip 222.

After the procedure of temporarily storing the system parameters is completed, the solid state storage device 220 may enter the sleep mode. Consequently, from the time point t2 to the time point t3, the third IO terminal (IO3) and the fourth IO terminal (IO4) of the control chip 222 issue two successive high voltage levels to the input terminal D and the clock terminal CLK of the D type flip-flop 227, respectively. The generation of the two successive high voltage levels from the third IO terminal (IO3) and the fourth IO terminal (IO4) of the control chip 222 indicates that the acknowledge signal ACK is activated.

At the time point t4, the output terminal Q of the D type flip-flop 227 is at a high-level state (i.e. the wake-up state). Since the two input terminals of the NAND gate 228 are both at the high-level state, the output terminal of the NAND gate 228 is at a low-level state (i.e. the disable state). According to the disable state, the regulator 224 stops providing the first supply voltage Vp1 and the second supply voltage Vp2 to the control chip 222 and the flash memory modules 211~21N, respectively. Since the first supply voltage Vp1 is no longer received by the control chip 222, the third IO terminal (IO3) and the fourth IO terminal (IO4) of the control chip 222 are returned to the low-level state. That is, according to the acknowledge signal ACK, the sleep control circuit 226 controls the regulator 224 to stop providing the supply voltages and enters the sleep mode.

At the time point t5, the low voltage level of the device sleep signal DEVSLP indicates that the solid state storage device 220 needs to be awakened from the sleep mode. Consequently, the output terminal of the NAND gate 228 is at the high-level state (i.e. the enable state). According to the enable state, the regulator 224 generates the first supply voltage Vp1 and the second supply voltage Vp2 to the control chip 222 and the flash memory modules 211~21N, respectively. After the first supply voltage Vp1 is received by the control chip 222, the control chip 222 realizes that the host is previously in the sleep mode according to the wake-up state provided by the state terminal STE. Consequently, all system parameters are read out from the specified flash memory module by the control chip 222, and then the solid state storage device 220 enters the normal operation mode. In other words, after the time point t5, the solid state storage device 220 is restored to the normal operation mode.

From the time point t6 to the time point t9, the solid state storage device 220 enters the sleep mode again and then is awakened from the sleep mode. The operating principles are similar to those mentioned above, and are not redundantly described herein.

Figure 3C:
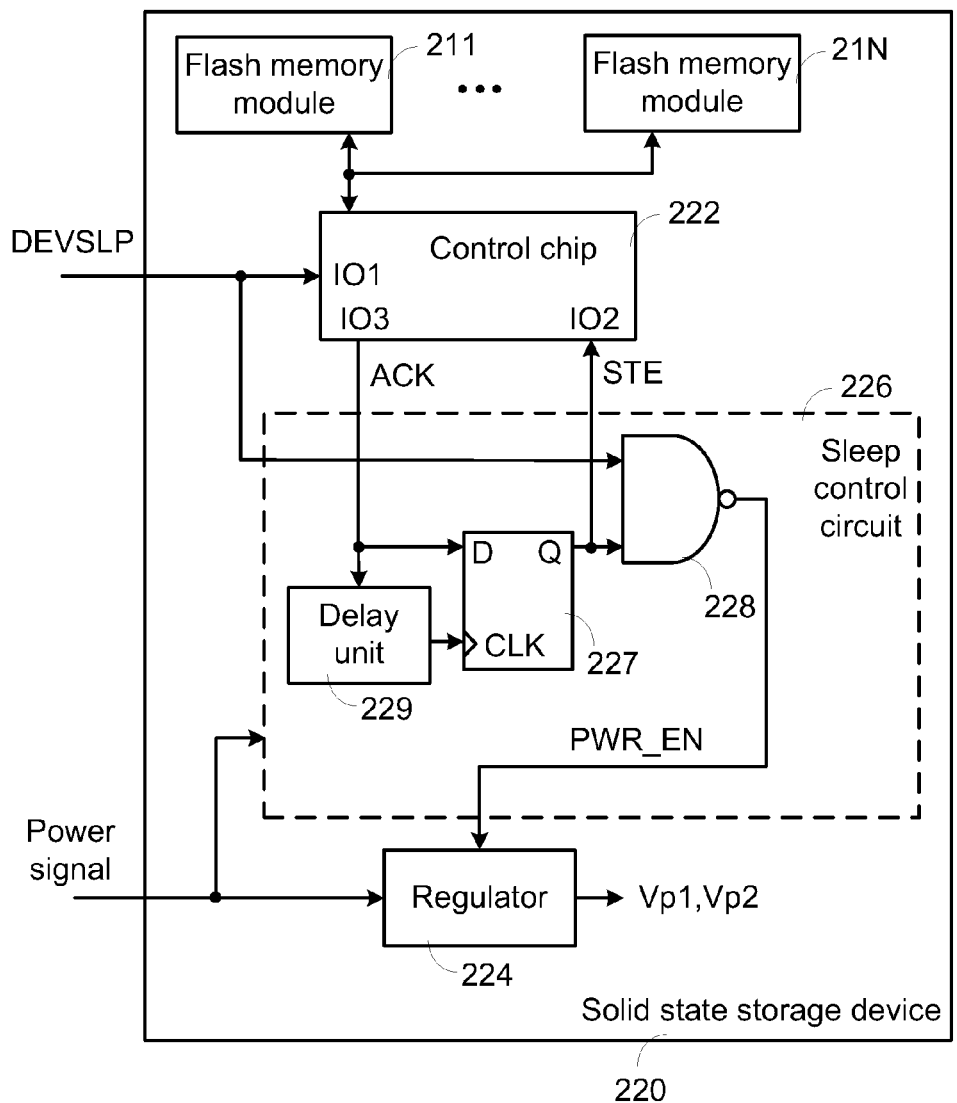
FIG. 3C is a schematic circuit diagram illustrating a variant of the solid state storage device according to the first embodiment of the present invention.

In the first embodiment, the generation of the two successive high voltage levels from the third IO terminal (IO3) and the fourth IO terminal (IO4) of the control chip 222 may be used to confirm that the acknowledge signal ACK is activated. However, those skilled in the art will readily observe that numerous modifications and alterations may be made while retaining the teachings of the invention. For example, in a variant example, the generation of a high voltage level from the third IO terminal (IO3) may be used to confirm that the acknowledge signal ACK is activated. FIG. 3C is a schematic circuit diagram illustrating a variant of the solid state storage device according to the first embodiment of the present invention. In comparison with FIG. 3A, the sleep control circuit 226 of the solid state storage device of FIG. 3C further comprises a delay unit 229. The input terminal of the delay unit 229 is connected to the third IO terminal (IO3), and the output terminal of the delay unit 229 is connected to the clock terminal CLK of the D type flip-flop 227. Consequently, when a high voltage level is outputted from the third IO terminal (IO3), two successive high voltage levels are sequentially issued to the D type flip-flop 227. After the sleep control circuit 226 confirms that the acknowledge signal ACK is activated, the sleep control circuit 226 controls the regulator 224 to stop providing the supply voltages and enter the sleep mode.

In the solid state storage device, the number of the flash memory modules that can be managed by the control chip is limited. That is, the capacity of the solid state storage device including a single control chip has an upper limit. For fabricating a solid state storage device with higher capacity, the solid state storage device should have more control chips to control more flash memory modules.

Hereinafter, the solid state storage device with two control chips will be illustrated with reference to the following embodiments.

Figure 4:
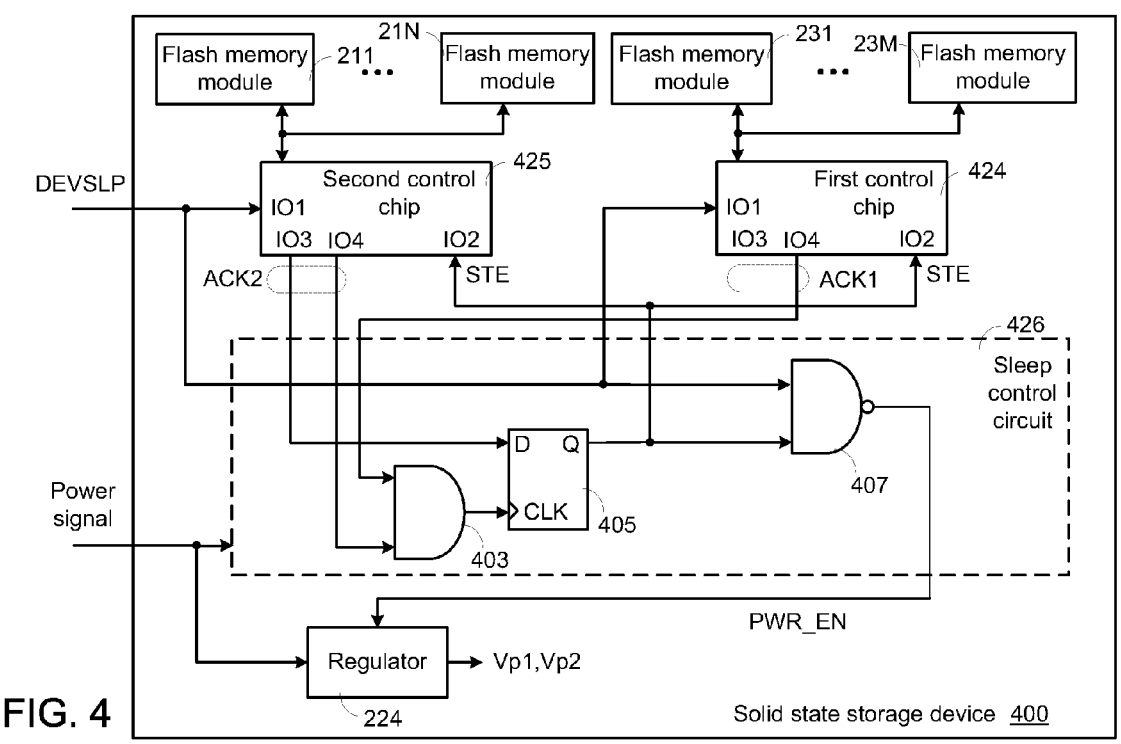
FIG. 4 is a schematic circuit diagram illustrating a solid state storage device according to a second embodiment of the present invention.

FIG. 4 is a schematic circuit diagram illustrating a solid state storage device according to a second embodiment of the present invention. As shown in FIG. 4, the solid state storage device 400 comprises a first control chip 424, a second control chip 425, a sleep control circuit 426, a regulator 224, and plural flash memory modules 211~21N and 231~23M. After the power signal and the enable state at the regulator enable terminal PWR_EN are received by the regulator 224, the regulator 224 provides the first supply voltage Vp1 and the second supply voltage Vp2 to the first control chip 424, the second control chip 425 and the flash memory modules 211~21N and 231~23M.

In this embodiment, the low voltage level of the device sleep signal DEVSLP denotes a non-sleep mode, and the high voltage level of the device sleep signal DEVSLP denotes the sleep mode. Moreover, the high voltage level at the regulator enable terminal PWR_EN denotes the enable state, and the low voltage level at the regulator enable terminal PWR_EN denotes the disable state. Moreover, the power signal is continuously provided to the sleep control circuit 426. Moreover, each of the first control chip 424 and the second control chip 425 has plural input/output (IO) terminals (IO1, IO2, IO3 and IO4). The device sleep signal DEVSLP is received by the first IO terminal (IO1).

As shown in FIG. 4, the sleep control circuit 426 comprises a D type flip-flop 405, an AND gate 403, and a NAND gate 407. The input terminal D of the D type flip-flop 405 is connected to the third IO terminal (IO3) of the second control chip 425. The fourth IO terminal (IO4) of the first control chip 424 and the fourth IO terminal (IO4) of the second control chip 425 are connected to the two input terminals of the AND gate 403, respectively. The output terminal of the AND gate 403 is connected to the clock terminal CLK of the D type flip-flop 405. The device sleep signal DEVSLP is also received by the first input terminal of the NAND gate 407. The second input terminal of the NAND gate 407 is connected to the output terminal Q of the D type flip-flop 405. The output terminal Q of the D type flip-flop 405 is used as the state terminal STE of the sleep control circuit 426, and connected to the second IO terminal (IO2) of the first control chip 424 and the second IO terminal (IO2) of the second control chip 425. Moreover, the output terminal of the NAND gate 407 is used as the regulator enable terminal PWR_EN of the sleep control circuit 426, and connected to the regulator 224.

In this embodiment, the flash memory modules 211~21N and the flash memory modules 231~23M are respectively accessed by the first control chip 424 and the second control chip 425 according to a control signal (not shown).

After the host is powered on, the power signal (e.g. 5V) is provided to the solid state storage device 400. Meanwhile, the low voltage level of the device sleep signal DEVSLP denotes the non-sleep mode. The power signal is also provided to the sleep control circuit 426. Since the output terminal Q of the D type flip-flop 405 is inactivated, the output terminal Q of the D type flip-flop 405 is at a low-level state (i.e. the power on state). Since the two input terminals of the NAND gate 407 are both at the low-level state, the output terminal of the NAND gate 407 is at a high-level state (i.e. the enable state).

After the power signal is received by the regulator 224, according to the enable state, the regulator 224 generates the first supply voltage Vp1 and the second supply voltage Vp2 to the first control chip 424, the second control chip 425 and the flash memory modules 211~21N and 231~23M.

After the first supply voltage Vp1 is received by the two control chips 424 and 425, the two control chips 424 and 425 realizes that the host is powered on according to the power-on state provided by the state terminal STE. Consequently, the two control chips 424 and 425 perform a start-up procedure. After the start-up procedure is completed, the solid state storage device 400 enters a normal operation mode.

When the device sleep signal DEVSLP is at the high-level state, the solid state storage device 400 enters the sleep mode. Meanwhile, the first IO terminals (IO1) of the two control chips 424 and 425 detect that the device sleep signal DEVSLP is activated. Consequently, respective system parameters are temporarily stored in respective flash memory modules by the two control chips 424 and 425.

After the procedure of temporarily storing the system parameters is completed, the solid state storage device 400 may enter the sleep mode. Consequently, the third IO terminal (IO3) and the fourth IO terminal (IO4) of the second control chip 425 and the fourth IO terminal (IO4) of the first control chip 424 issue three successive high voltage levels, respectively. The high voltage level from the third IO terminal (IO3) of the second control chip 425 is inputted into the input terminal D of the D type flip-flop 405. The fourth IO terminal (IO4) of the first control chip 424 and the fourth IO terminal (IO4) of the second control chip 425 are connected to the two input terminals of the AND gate 403, respectively. The output terminal of the AND gate 403 is connected to the clock terminal CLK of the D type flip-flop 405. In other words, the use of the AND gate 403 may confirm that both of the two control chips 424 and 425 can enter the sleep mode. Consequently, the regulator enable terminal PWR_EN of the sleep control circuit 426 can be controlled to be at the low-level state (i.e. the disable state). Under this circumstance, the regulator 224 will stop providing the first supply voltage Vp1 and the second supply voltage Vp2, and enter the sleep mode.

When the device sleep signal DEVSLP is at the low-level state, the solid state storage device 400 needs to be awakened from the sleep mode. Consequently, the output terminal of the NAND gate 407 is at the high-level state (i.e. the enable state). According to the enable state, the regulator 224 generates the first supply voltage Vp1 and the second supply voltage Vp2 to the first control chip 424, the second control chip 425 and the flash memory modules 211~21N and 231~23M. After the first supply voltage Vp1 is received by the two control chips 424 and 425, the two control chips 424 and 425 realize that the host is previously in the sleep mode according to the wake-up state provided by the state terminal STE. Consequently, respective system parameters are read out from respective flash memory modules by the two control chips 424 and 425, and then the solid state storage device 400 is restored to the normal operation mode.

In the second embodiment, the third IO terminal (IO3) and the fourth IO terminal (IO4) of the first control chip 424 may be used as a first acknowledge signal ACK1, and the third IO terminal (IO3) and the fourth IO terminal (IO4) of the second control chip 425 may be used as a second acknowledge signal ACK2. However, those skilled in the art will readily observe that numerous modifications and alterations may be made while retaining the teachings of the invention. For example, in a variant example, the third IO terminal (IO3) of the first control chip 424 and the fourth IO terminal (IO4) of the second control chip 425 are connected to the two input terminals of the AND gate 403, respectively.

Figure 5:
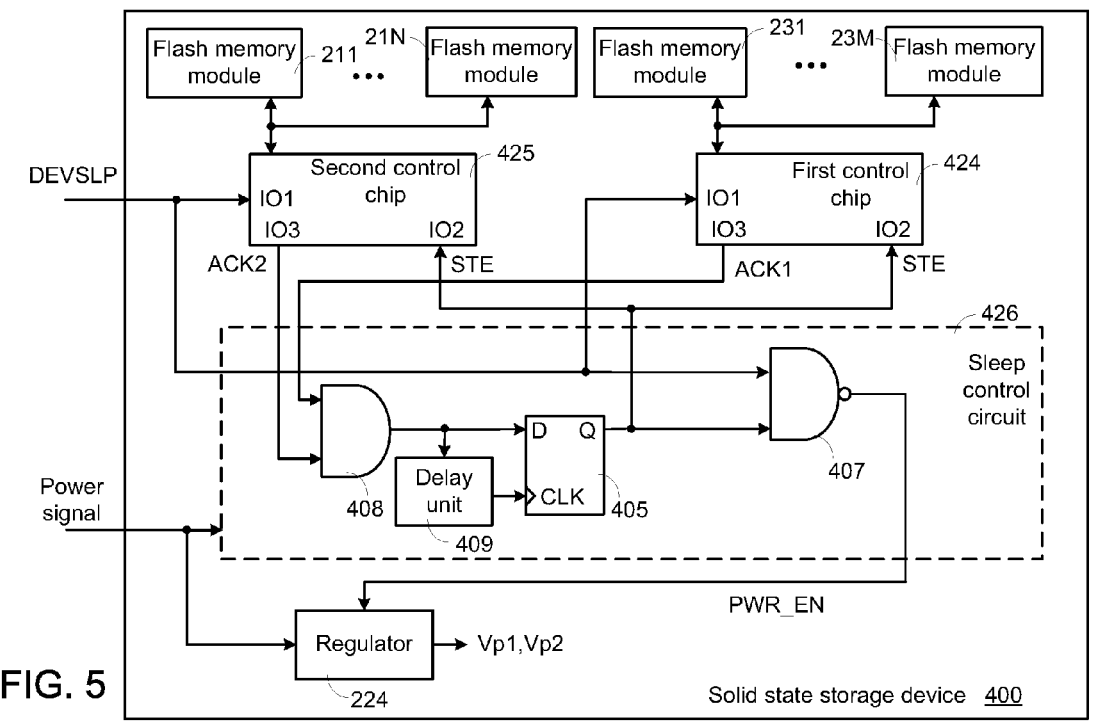
FIG. 5 is a schematic circuit diagram illustrating a variant of the solid state storage device according to the second embodiment of the present invention.

Alternatively, the third IO terminal (IO3) of the first control chip 424 may be used as the first acknowledge signal ACK1, and the third IO terminal (IO3) of the second control chip 425 may be used as a second acknowledge signal ACK2. FIG. 5 is a schematic circuit diagram illustrating a variant of the solid state storage device according to the second embodiment of the present invention. In comparison with FIG. 4, the sleep control circuit 426 of the solid state storage device of FIG. 5 further comprises a delay unit 409. The two third IO terminals (IO3) of the two control chips 424 and 425 are connected to the two input terminals of the AND gate 408, respectively. The output terminal of the AND gate 408 is connected to the input terminal D of the D type flip-flop 405 and the input terminal of the delay unit 409. The output terminal of the delay unit 409 is connected to the clock terminal CLK of the D type flip-flop 405. Consequently, when two high voltage levels are outputted from the two third IO terminals (IO3) of the two control chips 424 and 425, two successive high voltage levels are sequentially issued to the D type flip-flop 405. After the sleep control circuit 426 confirms that the two acknowledge signals ACK1 and ACK2 are activated, the sleep control circuit 426 controls the regulator 224 to enter the sleep mode.

Figure 6:
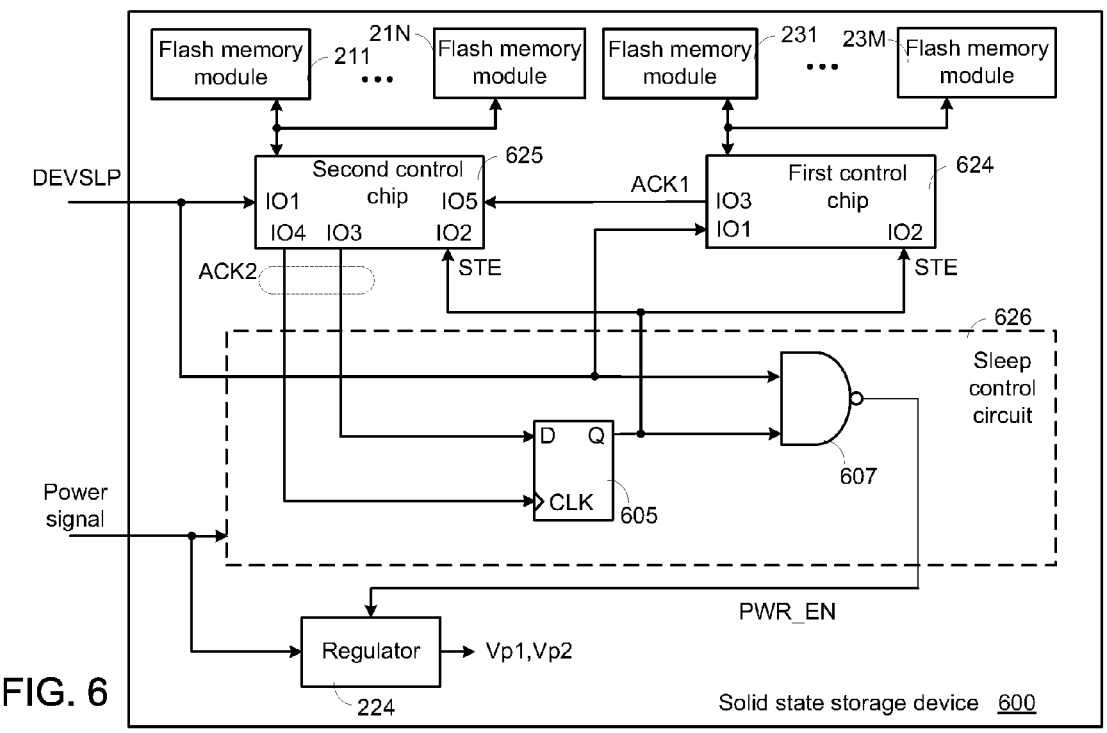
FIG. 6 is a schematic circuit diagram illustrating a solid state storage device according to a third embodiment of the present invention.

FIG. 6 is a schematic circuit diagram illustrating a solid state storage device according to a third embodiment of the present invention. As shown in FIG. 6, the solid state storage device 600 comprises a first control chip 624, a second control chip 625, a sleep control circuit 626, a regulator 224, and plural flash memory modules 211~21N and 231~23M.

As shown in FIG. 6, the sleep control circuit 626 comprises a D type flip-flop 605 and a NAND gate 607. The input terminal D of the D type flip-flop 605 is connected to the third IO terminal (IO3) of the second control chip 625. The clock terminal CLK of the D type flip-flop 605 is connected to the fourth IO terminal (IO4) of the second control chip 625. The device sleep signal DEVSLP is also received by the first input terminal of the NAND gate 607. The second input terminal of the NAND gate 607 is connected to the output terminal Q of the D type flip-flop 605. The output terminal Q of the D type flip-flop 605 is used as the state terminal STE of the sleep control circuit 626, and connected to the second IO terminals (IO2) of the first control chip 624 and the second control chip 625. Moreover, the output terminal of the NAND gate 607 is used as the regulator enable terminal PWR_EN of the sleep control circuit 626, and connected to the regulator 224.

In this embodiment, when the device sleep signal DEVSLP is at the high-level state, the solid state storage device 600 enters the sleep mode. Meanwhile, the first IO terminals (IO1) of the two control chips 624 and 625 detect that the device sleep signal DEVSLP is activated. Consequently, respective system parameters are temporarily stored in respective flash memory modules by the two control chips 624 and 625.

The third IO terminal (IO3) of the first control chip 624 is used as a first acknowledge signal ACK1. According to the first acknowledge signal ACK1, the second control chip 625 is informed that the first control chip 624 is ready to enter the sleep mode.

After the first acknowledge signal ACK1 is received by a fifth IO terminal (IO5) of the second control chip 625 and the second control chip 625 is ready to enter the sleep mode, the third IO terminal (IO3) and the fourth IO terminal (IO4) of the second control chip 625 issue two successive high voltage levels to the input terminal D and the clock terminal CLK of the D type flip-flop 605, respectively. Under this circumstance, the solid state storage device 600 is controlled to enter the sleep mode. The way of awaking the solid state storage device 600 from the sleep mode is similar to that of the above embodiment, and is not redundantly described herein.

Figure 7:
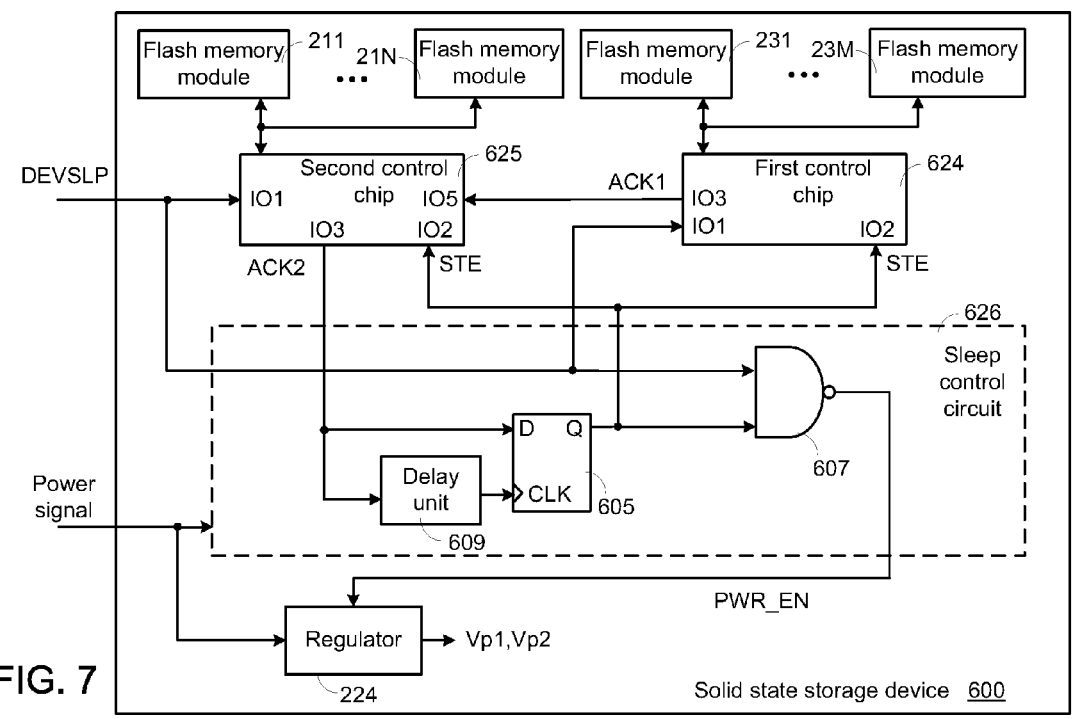
FIG. 7 is a schematic circuit diagram illustrating a variant of the solid state storage device according to the third embodiment of the present invention.

However, those skilled in the art will readily observe that numerous modifications and alterations may be made while retaining the teachings of the invention. For example, in a variant example, the third IO terminal (IO3) of the second control chip 625 may be used as the second acknowledge signal ACK2. FIG. 7 is a schematic circuit diagram illustrating a variant of the solid state storage device according to the third embodiment of the present invention. In comparison with FIG. 6, the sleep control circuit 626 of the solid state storage device of FIG. 7 further comprises a delay unit 609. The third IO terminal (IO3) of the second control chip 625 is connected to the input terminal of the delay unit 609. The output terminal of the delay unit 609 is connected to the clock terminal CLK of the D type flip-flop 605. Consequently, when a high voltage level is outputted from the third IO terminal (IO3) of the second control chip 625, two successive high voltage levels are sequentially issued to the D type flip-flop 605.

From the above descriptions, the present invention provides a solid state storage device and a sleep control circuit thereof. The sleep control circuit is implemented by a simple logic circuit. Although the control chip is unable to support the sleep mode, the additional sleep control circuit included in the solid state storage device can allow the solid state storage device to enter the sleep mode or awake the solid state storage device from the sleep mode to the normal operation mode.

In practical applications, if the solid state storage device is operated in the idle mode, the power consumption of the solid state storage device is about 1.5 W. If the sleep control circuit of the present invention is included in the solid state storage device, the power consumption of the solid state storage device in the sleep mode is about 0.6 W. Consequently, the power consumption of the solid state storage device is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device receiving a device sleep signal and a power signal from a host, the solid state storage device comprising:
   a control chip receiving the device sleep signal, wherein the control chip is connected to a flash memory module, wherein if the device sleep signal is activated, the control chip temporarily stores a system parameter into the flash memory module and then generates an acknowledge signal;
   a sleep control circuit receiving the power signal, the device sleep signal and the acknowledge signal, wherein if both of the device sleep signal and the acknowledge signal are activated, the sleep control circuit generates a disable state and a wake-up state; and
   a regulator, wherein if the power signal is received by the regulator and the sleep control circuit generates the disable state, the regulator stops providing a supply voltage to the control chip, so that the solid state storage device enters a sleep mode.

2. The solid state storage device as claimed in claim 1, wherein if the device sleep signal is inactivated, the sleep control circuit generates an enable state, so that the regulator provides the supply voltage to the control chip, wherein after the supply voltage is received by the control chip, the control chip reads the system parameter from the flash memory module according to the wake-up state, so that the solid state storage device is awakened from the sleep mode.

3. The solid state storage device as claimed in claim 2, the sleep control circuit comprises:
   a NAND gate having a first input terminal, a second input terminal and an output terminal, wherein the device sleep signal is inputted into the first input terminal of the NAND gate, and the enable state or the disable state is outputted from the output terminal of the NAND gate; and
   a D type flip-flop controlled by the acknowledge signal, wherein an output terminal of the D type flip-flop is connected to the second input terminal of the NAND gate;
   wherein if the acknowledge signal is activated, the output terminal of the D type flip-flop generates the wake-up state, and the disable state is outputted from the output terminal of the NAND gate.

4. The solid state storage device as claimed in claim 3, wherein the control chip further comprises two input/output terminals, wherein two successive high voltage levels are sequentially issued from the two input/output terminals to an input terminal and a clock terminal of the D type flip-flop so as to be used as the acknowledge signal.

5. The solid state storage device as claimed in claim 3, wherein the sleep control circuit further comprises a delay unit, and the control chip further comprises an input/output terminal to generate the acknowledge signal, wherein the input/output terminal is connected to an input terminal of the D type flip-flop and an input terminal of the delay unit, and an output terminal of the delay unit is connected to a clock terminal of the D type flip-flop.

6. A solid state storage device receiving a device sleep signal and a power signal from a host, the solid state storage device comprising:
   a first control chip receiving the device sleep signal, wherein the first control chip is connected to a first group of flash memory modules, wherein if the device sleep signal is activated, the first control chip temporarily stores a first system parameter into the first group of flash memory modules and then generates a first acknowledge signal;
   a second control chip receiving the device sleep signal, wherein the second control chip is connected to a second group of flash memory modules, wherein if the device sleep signal is activated, the second control chip temporarily stores a second system parameter into the second group of flash memory modules and then generates a second acknowledge signal;
   a sleep control circuit receiving the power signal, the device sleep signal, the first acknowledge signal and the second acknowledge signal, wherein if all of the device sleep signal, the first acknowledge signal and the second acknowledge signal are activated, the sleep control circuit generates a disable state and a wake-up state; and
   a regulator, wherein if the power signal is received by the regulator and the sleep control circuit generates the disable state, the regulator stops providing a supply voltage to the first control chip and the second control chip, so that the solid state storage device enters a sleep mode.

7. The solid state storage device as claimed in claim 6, wherein if the device sleep signal is inactivated, the sleep control circuit generates an enable state, so that the regulator provides the supply voltage to the first control chip and the second control chip, wherein after the supply voltage is received by the first control chip and the second control chip, the first control chip reads the first system parameter from the first group of flash memory modules according to the wake-up state and the second control chip reads the second system parameter from the second group of flash memory modules according to the wake-up state, so that the solid state storage device is awakened from the sleep mode.

8. The solid state storage device as claimed in claim 7, the sleep control circuit comprises:
   a NAND gate having a first input terminal, a second input terminal and an output terminal, wherein the device sleep signal is inputted into the first input terminal of the NAND gate, and the enable state or the disable state is outputted from the output terminal of the NAND gate;
   a D type flip-flop controlled by the first acknowledge signal and the second acknowledge signal, wherein an output terminal of the D type flip-flop is connected to the second input terminal of the NAND gate;

wherein if the first acknowledge signal and the second acknowledge signal are activated, the output terminal of the D type flip-flop generates the wake-up state, and the disable state is outputted from the output terminal of the NAND gate.

9. The solid state storage device as claimed in claim 8, wherein the first control chip further comprises a first input/output terminal, the second control chip comprises a second input/output terminal and a third input/output terminal, and the second input/output terminal is connected to an input terminal of the D type flip-flop, wherein the sleep control circuit further comprises an AND gate, and the AND gate has a first input terminal connected to the first input/output terminal, a second input terminal connected to the third input/output terminal and an output terminal connected to a clock terminal of the D type flip-flop, wherein two successive high voltage levels are sequentially issued from the second input/output terminal and the third input/output terminal so as to be used as the second acknowledge signal.

10. The solid state storage device as claimed in claim 8, wherein the sleep control circuit further comprises an AND gate and a delay unit, the first control chip further comprises a first input/output terminal to generate the first acknowledge signal, and the second control chip further comprises a second input/output terminal to generate the second acknowledge signal, wherein the first input/output terminal and the second input/output terminal are respectively connected to two input terminals of the AND gate, an output terminal of the AND gate is connected to an input terminal of the D type flip-flop and an input terminal of the delay unit, and an output terminal of the delay unit is connected to a clock terminal of the D type flip-flop.

11. A solid state storage device receiving a device sleep signal and a power signal from a host, the solid state storage device comprising:
a first control chip receiving the device sleep signal, wherein the first control chip is connected to a first group of flash memory modules, wherein if the device sleep signal is activated, the first control chip temporarily stores a first system parameter into the first group of flash memory modules and then generates a first acknowledge signal;
a second control chip receiving the device sleep signal, wherein the second control chip is connected to a second group of flash memory modules, wherein if the device sleep signal is activated, the second control chip temporarily stores a second system parameter into the second group of flash memory modules, wherein after the first acknowledge signal is received by the second control chip, the second control chip generates a second acknowledge signal;
a sleep control circuit receiving the power signal, the device sleep signal and the second acknowledge signal, wherein if both of the device sleep signal and the second acknowledge signal are activated, the sleep control circuit generates a disable state and a wake-up state; and
a regulator, wherein if the power signal is received by the regulator and the sleep control circuit generates the disable state, the regulator stops providing a supply voltage to the first control chip and the second control chip, so that the solid state storage device enters a sleep mode.

12. The solid state storage device as claimed in claim 11, wherein if the device sleep signal is inactivated, the sleep control circuit generates an enable state, so that the regulator provides the supply voltage to the first control chip and the second control chip, wherein after the supply voltage is received by the first control chip and the second control chip, the first control chip reads the first system parameter from the first group of flash memory modules according to the wake-up state and the second control chip reads the second system parameter from the second group of flash memory modules according to the wake-up state, so that the solid state storage device is awakened from the sleep mode.

13. The solid state storage device as claimed in claim 12, the sleep control circuit comprises:
a NAND gate having a first input terminal, a second input terminal and an output terminal, wherein the device sleep signal is inputted into the first input terminal of the NAND gate, and the enable state or the disable state is outputted from the output terminal of the NAND gate; and
a D type flip-flop controlled by the second acknowledge signal, wherein an output terminal of the D type flip-flop is connected to the second input terminal of the NAND gate;
wherein if the second acknowledge signal is activated, the output terminal of the D type flip-flop generates the wake-up state, and the disable state is outputted from the output terminal of the NAND gate.

14. The solid state storage device as claimed in claim 13, wherein the second control chip further comprises two input/output terminals, wherein two successive high voltage levels are sequentially issued from the two input/output terminals to an input terminal and a clock terminal of the D type flip-flop so as to be used as the second acknowledge signal.

15. The solid state storage device as claimed in claim 13, wherein the sleep control circuit further comprises a delay unit, and the second control chip further comprises an input/output terminal to generate the second acknowledge signal, wherein the input/output terminal is connected to an input terminal of the D type flip-flop and an input terminal of the delay unit, and an output terminal of the delay unit is connected to a clock terminal of the D type flip-flop.

* * * * *